(12) United States Patent
Extrand

(10) Patent No.: US 6,976,585 B2
(45) Date of Patent: *Dec. 20, 2005

(54) WAFER CARRIER WITH ULTRAPHOBIC SURFACES

(75) Inventor: Charles W. Extrand, Minneapolis, MN (US)

(73) Assignee: Entegris, Inc., Chaska, MN (US)

( * ) Notice: Subject to any disclaimer, the term of this patent is extended or adjusted under 35 U.S.C. 154(b) by 215 days.

This patent is subject to a terminal disclaimer.

(21) Appl. No.: 10/454,743

(22) Filed: Jun. 3, 2003

(65) Prior Publication Data

US 2004/0206663 A1 Oct. 21, 2004

Related U.S. Application Data

(60) Provisional application No. 60/462,963, filed on Apr. 15, 2003.

(51) Int. Cl.[7] ........................... B65D 85/48; B65D 1/36; A47F 7/00
(52) U.S. Cl. ...................... 206/454; 206/564; 206/565; 206/711; 211/41.18
(58) Field of Search ................................ 206/710–712, 206/454, 557–565; 294/159; 211/41.18

(56) References Cited

U.S. PATENT DOCUMENTS

| | | |
|---|---|---|
| 5,252,835 A | 10/1993 | Lieber et al. |
| 5,609,907 A | 3/1997 | Natan |
| 5,679,460 A | 10/1997 | Schakenraad et al. |
| 5,725,788 A | 3/1998 | Maracas et al. |
| 5,788,304 A * | 8/1998 | Korn et al. ............ 294/159 |
| 5,900,160 A | 5/1999 | Whitesides et al. |

(Continued)

OTHER PUBLICATIONS

Didem Öner et al., *Ultrahydrophobic Surfaces. Effects of Topography Length Scales on Wettability*, Langmuir 2000, Jun. 23, 2000, vol. 16, No. 20, pp. 7777–7782.

Robert H. Dettre et al., *Contact Angle Hysteresis II. Contact Angle Measurements on Rough Surfaces*, Advances in Chemistry Series, Mar. 22, 1963, pp. 136–144.

A.B.D. Cassie et al., *Wettability of Porous Surfaces*, Jun. 19, 1944, pp. 546–551.

C. Rascón et al., *Geometry–dominated fluid adsorption on sculpted solid substrates*, Nature, Oct. 26, 2000, vol. 407, pp. 986–989.

R. G. Cox, *The spreading of a liquid on a rough surface*, J. Fluid Mech., 1983, vol. 131, pp. 1–26.

G. McHale et al., *Analysis of Shape Distortions in Sessile Drops*, Langmuir, 2001, vol. 17, pp. 6995–6998.

A. Esztermann et al., *Triple–Point Wetting on Rough Substrates*, The American Physical Society, Feb. 4, 2002, vol. 88, No. 5, pp. 55702/1–55702/4.

(Continued)

*Primary Examiner*—Bryon P. Gehman
(74) *Attorney, Agent, or Firm*—Patterson, Thuente, Skaar & Christensen, P.A.

(57) ABSTRACT

A carrier with ultraphobic surfaces for promoting more effective cleaning and drying of the carrier. In the invention, entire surfaces or portions of surfaces of a carrier are made ultraphobic. The ultraphobic surfaces of the carrier cause liquids that may come in contact with the surface, such as may be used in cleaning, to quickly and easily "roll off" without leaving a liquid film or substantial number of liquid droplets. As a result, less time and energy is expended in drying the surfaces, and redeposited residue is minimized, thereby improving overall process quality. In addition, the ultraphobic surfaces may be resistant to initial deposition of contaminants, where the contaminants may be in liquid or vapor form.

25 Claims, 9 Drawing Sheets

U.S. PATENT DOCUMENTS

| | | | | |
|---|---|---|---|---|
| 6,086,127 | A | * | 7/2000 | Korn et al. .................. 294/159 |
| 6,092,851 | A | * | 7/2000 | Korn et al. .................. 294/159 |
| 6,209,555 | B1 | * | 4/2001 | Struven .................... 211/41.18 |
| 6,227,590 | B1 | * | 5/2001 | Korn et al. .................. 294/159 |
| 6,237,979 | B1 | * | 5/2001 | Korn et al. .................. 294/159 |
| 6,312,303 | B1 | | 11/2001 | Yaniv et al. |
| 6,403,388 | B1 | | 6/2002 | Birdsley et al. |
| 6,423,372 | B1 | | 7/2002 | Genzer et al. |
| 6,432,866 | B1 | | 8/2002 | Tennent et al. |
| 6,444,254 | B1 | | 9/2002 | Chilkoti et al. |
| 6,455,021 | B1 | | 9/2002 | Saito |
| 6,518,168 | B1 | | 2/2003 | Clem et al. |
| 6,530,554 | B2 | | 3/2003 | Shimmo et al. |
| 6,541,389 | B1 | | 4/2003 | Kubo et al. |
| 6,652,669 | B1 | * | 11/2003 | Reihs et al. ................ 148/241 |
| 2002/0025374 | A1 | | 2/2002 | Lee et al. |
| 2002/0034879 | A1 | | 3/2002 | Yun et al. |
| 2002/0114949 | A1 | | 8/2002 | Bower et al. |
| 2002/0122765 | A1 | | 9/2002 | Horiuchi et al. |
| 2002/0136683 | A1 | | 9/2002 | Smalley et al. |
| 2002/0150684 | A1 | | 10/2002 | Jayatissa |
| 2003/0047822 | A1 | | 3/2003 | Hori et al. |

OTHER PUBLICATIONS

S.G. Mason, *Wetting and Spreading—Some Effects of Surface Roughness*, Academic Press, 1978, pp. 321–326.

H. Kamusewitz et al., *The relation between Young's equilibrium contact angle and the hysteresis on rough paraffin was surfaces*, Elsevier Science B.V., 1999, pp. 271–279.

J.F. Oliver et al., *Liquid spreading on rough metal surfaces*, Journal of Materials Science, 1980, vol. 15, pp. 431–437.

James E. Smay et al., *Colloidal Inks for Directed Assembly of 3–D Periodic Structures*, Langmuir, 2002, vol. 18, pp. 5429–5437.

Darron E. Hill et al., *Functionalization of Carbon Nanotubes with Polystyrene*, Macromolecules, 2002, vol. 35, pp. 9466–9471.

Robert J. Good, *A Thermodynamic Derivation of Wenzel's Modification of Young's Equation for Contact Angles; Together with a Theory of Hysteresis* Journal of American Chemical Society, Oct. 20, 1952, vol. 74, pp. 5041–5042.

Erdal Bayramli et al., *Tensiometric studies on wetting. I. Some effects of surface roughness (theoretical)*, Canadian Journal of Chemistry, 1981, vol. 59, pp. 1954–1961.

S. Semal et al., *Influence of Surface Roughness on Wetting Dynamics*, Langmuir, 1999, vol. 15, pp. 8765–8770.

J.F. Oliver et al., *The Apparent Contact Angle of Liquids on Finely–Grooved Solid Surfaces–A SEM Study*, Gordon and Breach Science Publishers Ltd., 1977, vol. 8, pp. 223–234.

A.J.G. Allan et al., *Wettability of Perfluorocarbon Polymer Films: Effect of Roughness*, Journal of Polymer Science, 1959, vol. XXXIX, pp. 1–8.

J.B. Sweeney et al., *Equilibrium Thin Films on Rough Surfaces. 1. Capillary and Disjoining Effects*, Langmuir, 1993, vol. 9, pp. 1551–1555.

Wei Chen et al., *Ultrahydrophobic and Ultralyophobic Surfaces: Some Comments and Examples*, Langmuir, 1999, vol. 15, pp. 3395–3399.

Jeffrey P. Youngblood et al., *Ultrahydrophobic Polymer Surfaces Prepared by Simultaneous Ablation of Polypropylene and Sputtering of Poly(tetrafluoroethylene) Using Radio Frequency Plasma*, Macromolecules, 1999, vol. 32, pp. 6800–6806.

Joanna Aizenberg et al., *Direct Fabrication of Large Micropatterned Single Cyrstals*, Science, vol. 299, Feb. 21, 2003, pp. 1205–1208.

J.D. Eick et al., *Thermodynamics of Contact Angles*, Journal of Colloid and Interface Science, Nov. 1975, vol. 53, No. 2, pp. 235–248.

F.Y.H. Lin et al., *Effect of Surface Roughness on the Dependence of Contact Angles on Drop Size*, Journal of Colloid and Interface Science, 1993, vol. 159, pp. 86–59.

Peter S. Swain et al., *Contact Angles on Heterogeneous Surfaces: A New Look at Cassie's and Wenzel's Laws*, Langmuir, 1998, vol. 14, pp. 6772–6780.

Kiyoharu Tadanaga et al., *Formation Process of Super–Water–Repellent $Al_2O_3$ Coating Films with High Transparency by the Sol–Gel Method*, Communications of the American Ceramic Society, 1997, vol. 80, No. 12, pp. 3213–3216.

Kiyoharu Tadanaga et al., *Super–Water–Repellent $Al_2O_3$ Coating Films with High Transparency*, Communications of the American Ceramic Society, 1997, vol. 80, No. 4, pp. 1040–1042.

Shuhong Li et al., *Super–Hydrophobicity of Large–Area Honeycomb–Like Aligned Carbon Nanotubes*, Journal of Physical Chemistry, 2002, vol. 106, No. 36, pp. 9274–9276.

J. Kijlstra et al., *Roughness and topology of ultra–hydrophobic surfaces*, Elsevier Science B.V., 2002, vol. 206, pp. 521–529.

Masahide Taniguchi et al., *Effect of Undulations on Surface Energy. A Quantitive Assessment*, Langmuir, 2001, vol. 17, pp. 4312–4315.

David Quéré, *Surface Chemistry Fakir droplets*, News & Views, 2002, pp. 14–15.

Masahide Taniguchi et al., *Correcting for Surface Roughness: Advancing and Receding Contact Angles*, Langmuir, 2002, vol. 18, pp. 6465–6467.

M. Thieme et al., *Generation of Ultrahydrophobic Properties of Aluminuim—A First Step to Self–cleaning Transparently Coated Metal Surfaces*, Advanced Engin. Mater., Internet, 2001, vol. 9, pp. 1.

Zen Yoshimitsu et al., *Effects of Surface Structure on the Hydrophobicity and Sliding Behavior of Water Droplets*, Langmuir, 2002, vol. 18, 5818–5822.

David S. Soane et al., *Fluorsight*, Brennan Research Group, Jan. 2003, p. 15.

J.J. Bikerman, *Sliding of Drops From Surfaces of Different Roughness*, pp. 349–359.

A.B.D. Cassie, *Contact Angles*, Wool Industries Research Association, Jan. 27, 1948, pp. 11–16.

Eun Hee Cirlin et al., *Roughness and Anisotropy Effects on wettability of Polytetrafluoreothylene and Sodium–treated Polytetrafluoroethylene*, Journal of Polymer Science, 1973, vol. 11, pp. 785–799.

Pulp and Paper Research Institute of Canada, *Liquid Spreading: Edge Effect for Zero Contact Angle*, Journal of Colloid and Interface Science, Aug. 1978, vol. 66, No. 1, pp. 200–202.

Robert N. Wenzel, *Resistance of Solid Surfaces to Wetting by Water*, Industrial and Engineering Chemistry, Aug. 1936, vol. 28, No. 8, pp. 988–994.

Will H. Coghill et al., *Why Water Over–Fills a Tumbler*, Scientific American Supplement, Jul. 27, 1918, vol. 86, No. 2221, pp. 52–53.

R.D. Schulze et al., *Young's equilibrium contact angle on rough solid surfaces. Part I. An empirical determination*, J. Adhesion Sci. Technol., 1989, vol. 3, No. 1, pp. 39–48.

J.F. Oliver et al., *An Experimental Study of Some Effects of Solid Surface Roughness on Wetting, Colloids and Surfaces,* 1980, vol. 1, pp. 79–104.

Kiyoharu Tadanaga et al., *Superhydrophobic–Superhydrophilic Micropatterning on Flowerlike Alumina Coating Film by the Sol–Gel Method, American Chemical Society,* 2000, vol. 12, pp. 590–592.

S. Herminghaus, *Roughness–induces non–wetting, Europhysics Letters,* Oct. 15, 2000, vol. 52, pp. 165–170.

J. Bico et al., *Rough wetting, Europhysics Letters,* Jul. 15, 2001 vol. 55, pp. 214–220.

Randy Doyle Hazlett, *Fractal Applications: Wettability and Contact Angle, Journal of Colloid and Interface Science,* Jul. 1990, vol. 137, No. 2, 527–533.

Y. Tamai et al., *Experimental Study of the Relation between Contact Angle and Surface Roughness, The Journal of Physical Chemistry,* 1972, vol. 76, No. 22, pp. 3267–3271.

J. Kijlstra et al., *Roughness and topology of ultra–hydrophobic surfaces, Colloids and Surfaces,* 2002, vol. 206, pp. 521–529.

Satoshi Shibuichi et al., *Super Water–Repellent Surfaces Resulting from Fractal Structure, J. Phys. Chem.,* 1996, vol. 100, pp. 19512–19517.

J. Bico et al., *Pearl drops, Europhysics Letters,* Jul. 15, 1999, vol. 47, No. 2, pp. 220–226.

H. Yildirim Erbil et al., *Transformation of a Simple Plastic into a Superhydrophobic Surface, Science,* Feb. 28, 2002, vol. 299, pp. 1377–1380.

J.D. Miller et al., *Effect of Roughness as Determined by Atomic Force Microscopy on the Wetting Properties of PTFE Thin Films\*, Polymer Engineering and Science,* Jul. 1996, vol. 36, No. 14, pp. 1849–1855.

Atsushi Hozumi et al., *Preparation of ultra water–repellent films by microwave plasma–enchanced CVD, Thin Solid Films,* 1997, pp. 222–225.

Brian D. Reiss et al., *DNA–Directed Assembly of Anisotropic Nanopaticles on Lithographically Defined Surfaces and in Solution, Materials Research Society,* 2001, vol. 635, pp. C6.2.1–C6.2.6.

F.E. Bartell et al., *Surface Roughness as Related to Hysteresis of Contact Angles.[1] I. The System Paraffin–Water–Air, J. Phys. Chem.,* Feb. 1953, vol. 57, pp. 211–215.

F.E. Bartell et al., *Surace Roughness as Related to Hysteresis of Contact Angles. II. The Systems Paraffin–3 Molar Calcium Chloride Solution–Air and Paraffin–Glycerol–Air[1]. J. Phys. Chem.,* Apr. 1953, vol. 57, pp. 455–463.

D. Richard et al., *Bouncing water drops, Europhysics letters,* Jun. 15, 2000, vol. 50, pp. 769–775.

Jun Yang et al., *Microfluid Flow in Circular Microchannel with Electrokinetic Effect and Navier's Slip Condition, Langmuir,* 2003, vol. 19, No. 4, pp. 1047–1053.

Neelesh A. Patankar, *On the Modeling of Hydrophobic Contact Angles on Rough Surfaces, Langmuir,* 2003, vol. 19, No. 4, pp. 1249–1253.

Suguru Okuyama et al., *Periodic Submicrocylinder Diamond Surfaces Using Two–Dimensional Fine Particle Arrays, Langmuir,* 2002, vol. 18, No. 22, pp. 8282–8287.

Yoshihito Kunugi et al., *Electro–organic reactions on organic electrodes., J. Electroanal. Chem.,* 1993, vol. 353, pp. 209–215.

C. Huh[1] et al., *Effects of Surface Roughness on Wetting (Theoretical), Journal of Colloid and Interface Science,* Jun. 1, 1977, vol. 60, No. 1, pp. 11–38.

Letter to the Editors, *Contact Angles by Scanning Electron Microscopy. Silicon Oil on Polished Aluminum, Journal of Collid and Interface Science,* Feb. 1971, vol. 35, No. 2, pp. 362–364.

Norman R. Morrow, *The Effects of Surface Roughness on Contact Angle with Special Reference to Petroleum Recovery, The Journal of Canadian Petroleum,* Oct.–Dec. 1975, pp. 42–54.

Pascale Aussillous et al., *Liquid Marbles, Nature,* Jun. 21, 2001, vol. 411, pp. 924–896.

Wei Jin et al., *Wetting Hysteresis at the Molecular Scale, Physical Review Letters,* Feb. 24, 1997, vol. 78, No. 8, pp. 1520–1523.

H.J. Busscher et al., *The Effect of Surface Roughening of Polymers on Measured Contact Angles of Liquids, Colloids and Surfaces,* 1984, pp. 319–331.

R. Shuttleworth et al., *The Spreading of a Liquid Over a Rough Solid,* Feb. 23, 1948, pp. 16–22.

J.F. Oliver et al., *Resistance to Spreading of Liquids by Sharp Edges[1], Journal of Colloid and Interface Science,* May 1977, vol. 59, No. 3, pp. 568–579.

T. Onda et al., *Super–Water–Repellent Fractal Surfaces, The ACS Journal of Surfaces and Colloids,* May 1, 1996, vol. 12, No. 9, pp. 2125–2127.

Phillip G. Wapner et al., *Partial Wetting Phenomena on Nonplanar Surfaces and in Shaped Microchannels, Langmuir,* 2002, vol. 18, No. 4, pp. 1225–1230.

Joonwon Kim et al., *Nanostructured Surfaces for Dramatic Reduction of Flow Resistance in Droplet–Based Microfluidics,* 2002, pp. 479–482.

\* cited by examiner

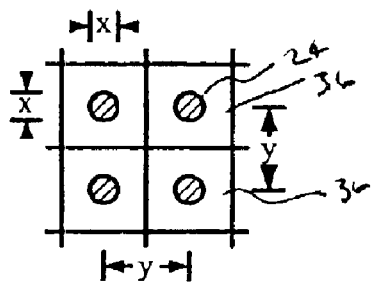
Fig. 11
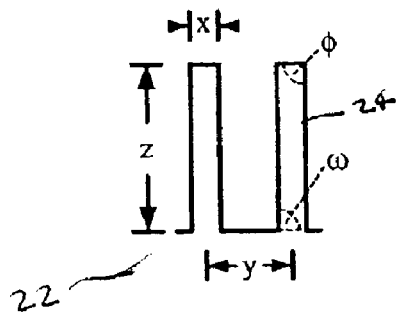
Fig. 12
| Geometry | Λ |
|---|---|
| Hexagonal array of square posts | $4x/y^2$ |
| Cubic array of square posts | $4x/y^2$ |
| Cubic array of circular posts | $\pi x/y^2$ |
Fig. 13

WAFER CARRIER WITH ULTRAPHOBIC SURFACES

RELATED APPLICATIONS

This application claims the benefit of U.S. Provisional Patent Application Ser. No. 60/462963, entitled "Ultraphobic Surface for High Pressure Liquids", filed Apr. 15, 2003, hereby fully incorporated herein by reference.

FIELD OF THE INVENTION

The present invention relates generally to carriers for delicate electronic components, and more particularly to a carrier having ultrahydrophobic or ultralyophobic surfaces formed thereon.

BACKGROUND OF THE INVENTION

The process of forming semi-conductor wafers or other delicate electronic components into useful articles requires high levels of precision and cleanliness. As these articles become increasingly complex and miniaturized, contamination concerns grow. Contamination problems are reduced by providing controlled fabrication environments known as "clean rooms". Such clean rooms are protected from chemical and particulate contamination to the extent technically and economically feasible.

While clean rooms substantially remove most contaminants found in ambient air, it is often not possible or advisable to completely process components in the same clean room environment. Moreover, not all contamination and contaminants are eliminated. For that and other reasons, delicate electronic components are transported, stored, and fabricated in bulk using protective carriers. Examples of specialized carriers are disclosed in U.S. Pat. Nos. 6,439,984; 6,428,729; 6,039,186; 6,010,008; 5,485,094; 5,944,194; 4,815,601; 5,482,161; 6,070,730; 5,711,427; 5,642,813; and 3,926,305, all assigned to the owner of the present invention, and all of which are hereby fully incorporated herein by reference. For the purposes of the present application, the term "carrier" includes, but is not limited to: semiconductor wafer carriers such as H-bar wafer carriers, Front Opening Unified Pods (FOUPs), and Standard Mechanical Interface Pods (SMIFs); reticle carriers; and other carriers used in the micro-electronic industry for storing, transporting, fabricating, and generally holding small electronic components such as hard drive disks and other miscellaneous mechanical devices.

Contamination and contaminants can be generated in many different ways. For example, particulates can be generated mechanically by wafers as they are inserted into and removed from wafer carriers, and as doors are attached and removed from the carriers, or they can be generated chemically in reaction to different processing fluids. Contamination can also be the result of out-gassing on the carrier itself, biological in nature due to human activity, or even the result of improper or incomplete washing of the carrier. Contamination can also occur on the exterior of a carrier as it is transported from station to station during processing.

Process contaminants and contamination may be reduced by periodically washing and/or cleaning carriers. Typically, a carrier is cleaned of contaminants and contamination by placing it in a cleaning apparatus, which subjects the exterior and interior surfaces to a flood or spray of cleaning fluids. After the washing step, a considerable amount of fluid may remain on the carrier. This residual fluid is typically dried with a stream of dry gas or by centrifugal spinning.

Carriers often have intricate arrangements of surfaces that are difficult to dry. In addition, a residual amount of the cleaning fluid may adhere to the surfaces of a carrier as a film or in a multiplicity of small droplets after the washing step. Any contaminants suspended in the residual cleaning fluid may be redeposited on the surface as the fluid dries, leading to contaminant carryover when the carrier is reused. Consequently, process efficiency and effectiveness is diminished overall.

What is still needed in the industry is a carrier with features that promote more effective cleaning and drying of the carrier with reduced levels of residual process contamination.

SUMMARY OF THE INVENTION

The present invention includes a carrier with ultraphobic surfaces for promoting more effective cleaning and drying of the carrier. In the invention, entire surfaces or portions of surfaces of a carrier are made ultraphobic. The ultraphobic surfaces of the carrier cause liquids that may come in contact with the surface, such as may be used in cleaning, to quickly and easily "roll off" without leaving a liquid film or substantial number of liquid droplets. As a result, less time and energy is expended in drying the surfaces, and redeposited residue is minimized, thereby improving overall process quality. In addition, the ultraphobic surfaces may be resistant to initial deposition of contaminants, where the contaminants may be in liquid or vapor form.

In a particularly preferred embodiment of the invention, the ultraphobic surface includes a multiplicity of closely spaced microscale to nanoscale asperities formed on a substrate. For the purpose of the present application, "microscale" generally refers to dimensions of less than 100 micrometers, and "nanoscale" generally refers to dimensions of less than 100 nanometers. The surface is designed to maintain ultraphobic properties up to a certain predetermined pressure value. The asperities are disposed so that the surface has a predetermined contact line density measured in meters of contact line per square meter of surface area equal to or greater than a contact line density value "$\Lambda_L$" determined according to the formula:

$$\Lambda_L = \frac{-P}{\gamma \cos(\theta_{a,0} + \omega - 90°)}$$

where P is the predetermined pressure value, $\gamma$ is the surface tension of the liquid, and $\theta_{a,0}$ is the experimentally measured true advancing contact angle of the liquid on the asperity material in degrees, and $\omega$ is the asperity rise angle. The predetermined pressure value may be selected so as to be greater than the anticipated liquid pressures expected to be encountered during cleaning or use of the carrier.

The asperities may be formed in or on the substrate material itself or in one or more layers of material disposed on the surface of the substrate. The asperities may be any regularly or irregularly shaped three dimensional solid or cavity and may be disposed in any regular geometric pattern or randomly. The asperities may be formed using photolithography, or using nanomachining, microstamping, microcontact printing, self-assembling metal colloid monolayers, atomic force microscopy nanomachining, sol-gel molding, self-assembled monolayer directed patterning, chemical etching, sol-gel stamping, printing with colloidal inks, or by disposing a layer of carbon nanotubes on the substrate.

Alternatively, randomly patterned surfaces may be produced by any of a variety of known processes, including chemical vapor deposition (CVD) or chemical modification processes such as cold gas plasma or corona discharge treatments.

The invention may also include a process for producing a carrier with surfaces having ultraphobic properties at liquid pressures up to a predetermined pressure value. The process includes steps of selecting an asperity rise angle; determining a critical contact line density "$\Lambda_L$" value according to the formula:

$$\Lambda_L = \frac{-P}{\gamma\cos(\theta_{a,0} + \omega - 90°)}$$

where P is the predetermined pressure value, γ is the surface tension of the liquid, and $\theta_{a,0}$ is the experimentally measured true advancing contact angle of the liquid on the asperity material in degrees, and ω is the asperity rise angle; providing a carrier with a surface portion; and forming a multiplicity of projecting asperities on the surface portion so that the surface has an actual contact line density equal to or greater than the critical contact line density.

The process may further include the step of determining a critical asperity height value "$Z_c$" in meters according to the formula:

$$Z_c = \frac{d(1 - \cos(\theta_{a,0} + \omega - 180°))}{2\sin(\theta_{a,0} + \omega - 180°)}$$

where d is the distance in meters between adjacent asperities, $\theta_{a,0}$ is the true advancing contact angle of the liquid on the surface in degrees, and ω is the asperity rise angle in degrees.

BRIEF DESCRIPTION OF THE DRAWINGS

FIG. 11 a partial top plan view of an alternative embodiment of the present invention wherein the asperities are cylindrical and are arranged in a rectangular array;

FIG. 12 is a side elevation view of the alternative embodiment of FIG. 11;

FIG. 13 is a table listing formulas for contact line density for a variety of asperity shapes and arrangements;

DETAILED DESCRIPTION OF THE PREFERRED EMBODIMENTS

Figure 1A:
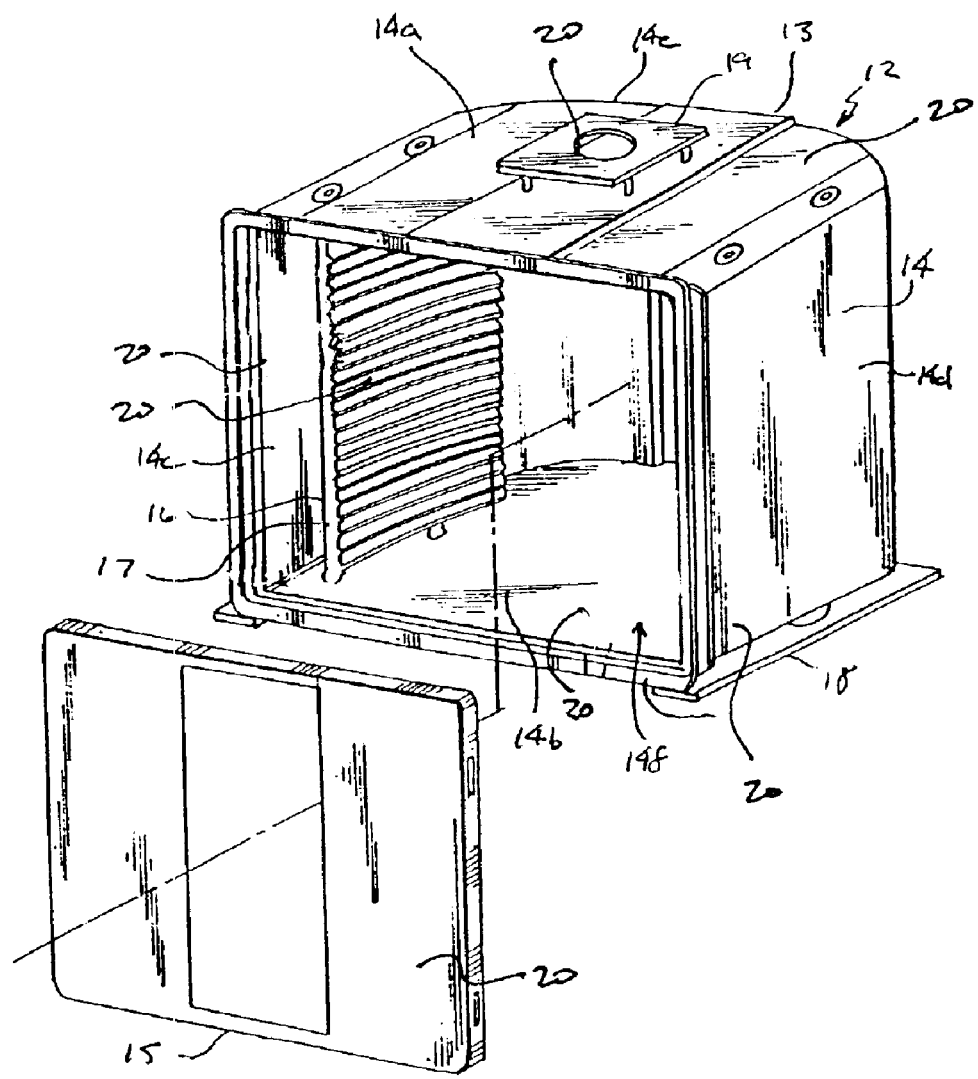
FIG. 1a is a perspective view of one embodiment of a carrier with ultraphobic surfaces thereon according to the present invention.

FIG. 1a depicts, in exemplary fashion, an embodiment of a carrier 12 according to the present invention. Carrier 12 generally includes a body portion 13 in the form of an enclosure 14, with a top 14a, a bottom 14b, a pair of opposing sides 14c, 14d, a back 14e, and an open front 14f. Open front 14f may be selectively closable by means of a door 15. Within enclosure 14, one or more device support portions 16, in the form of wafer supports 17, are provided to support wafers in a parallel, spaced apart, relationship to each other. Carrier 12 may have other components or portions for facilitating its use in a process, such as for example, a kinematic coupling portion 18, and a robotic handling flange 19.

Ultraphobic surface 20 may be formed on the entire surface of carrier 12 or on any desired portion thereof. Thus, ultraphobic surfaces may be placed in critical locations of the carrier 12 while other portions have conventional surfaces. Ultraphobic surfaces 20 may be formed in any of a variety of configurations and using a variety of processes as described hereinbelow.

Figure 1B:
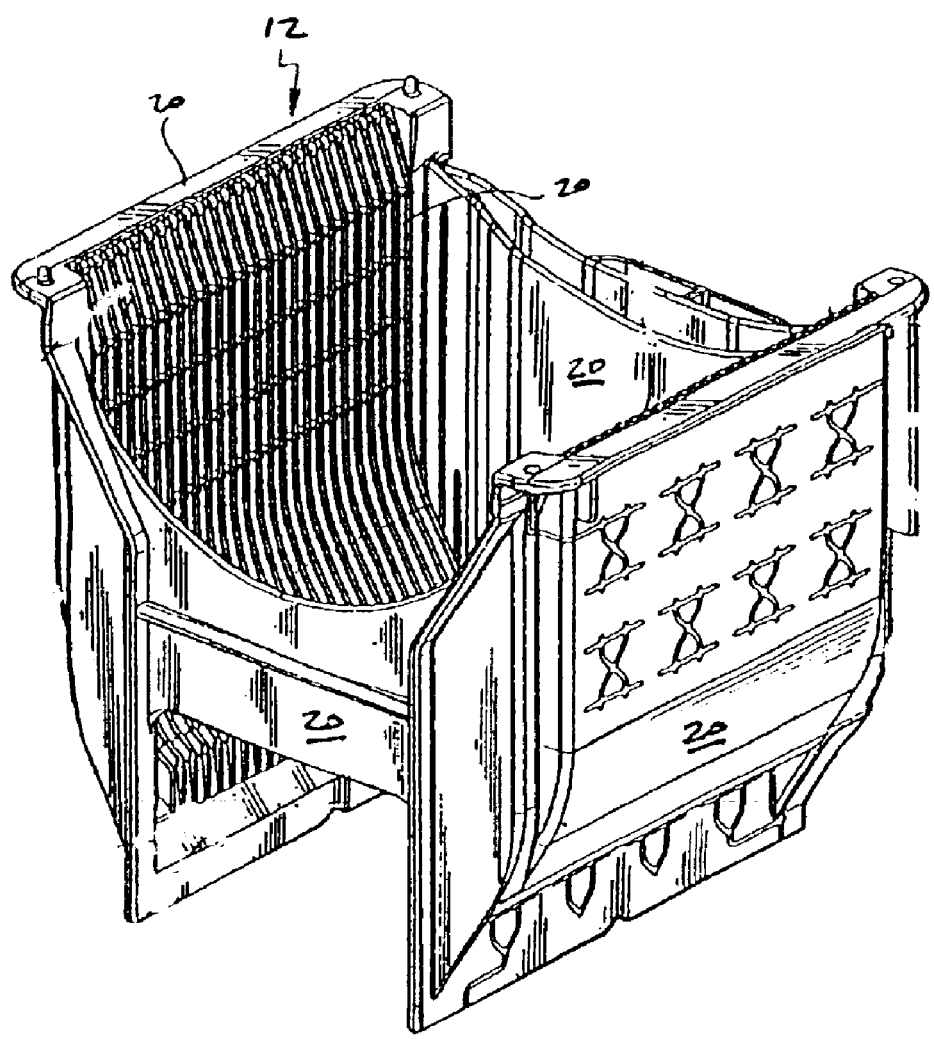
FIG. 1b is a perspective view of an alternative embodiment of a carrier with ultraphobic surfaces thereon according to the present invention.
Figure 1C:
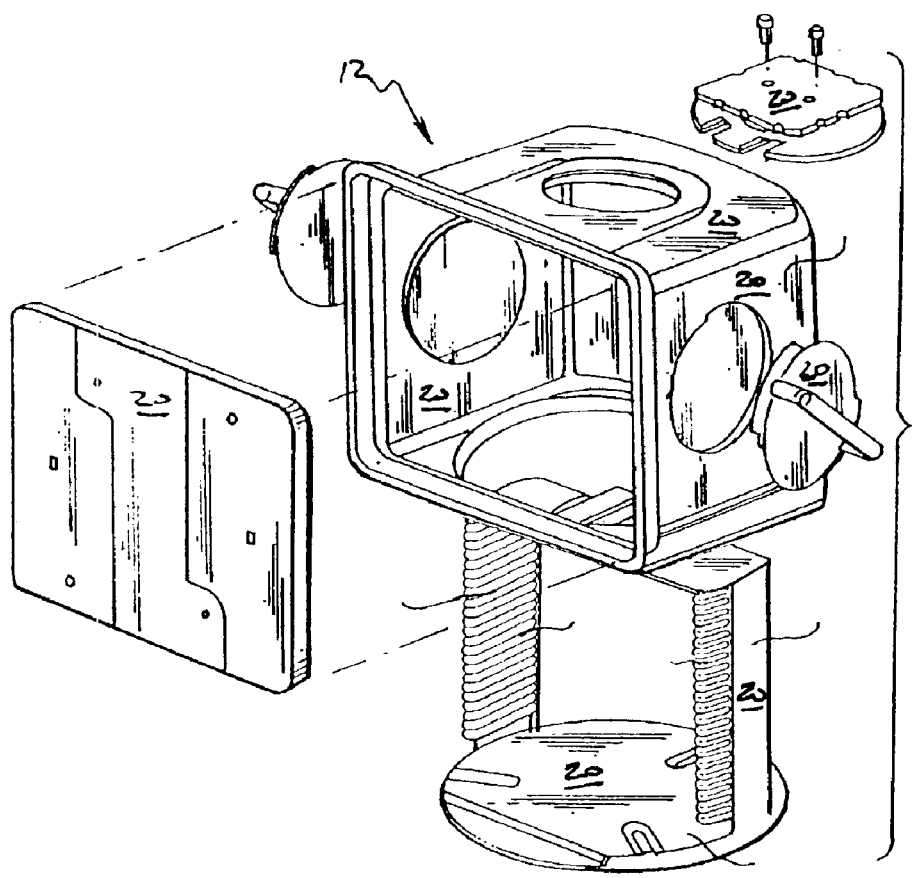
FIG. 1c is a perspective view of another alternative embodiment of a carrier with ultraphobic surfaces thereon according to the present invention.
Figure 1D:
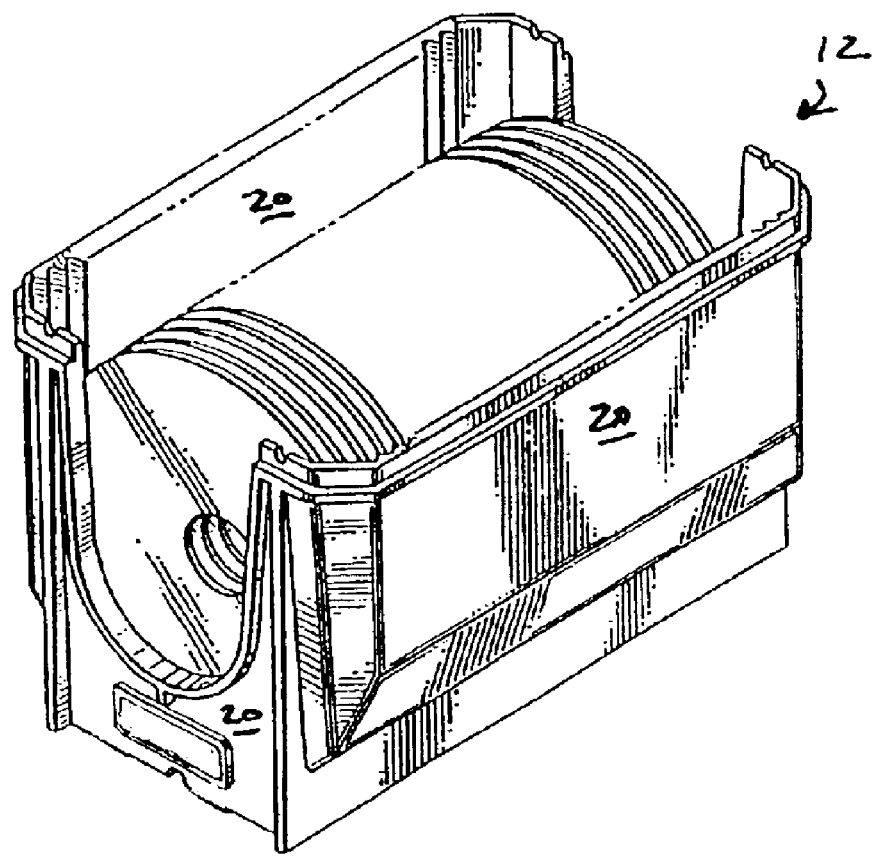
FIG. 1d is a perspective view of yet another alternative embodiment of a carrier with ultraphobic surfaces thereon according to the present invention.

Various other embodiments of carriers are depicted in FIGS. 1b–d. In each of these embodiments, ultraphobic surfaces 20 may be formed where desired on the carrier 12.

Surfaces resistant to wetting by liquids may be referred to as hydrophobic where the liquid is water, and lyophobic relative to other liquids. The surface may be generally referred to as an ultrahydrophobic or ultralyophobic surface if the surface resists wetting to an extent characterized by any or all of the following: very high advancing contact angles of liquid droplets with the surface (greater than about 120 degrees) coupled with low contact angle hysteresis values (less than about 20 degrees); a markedly reduced propensity of the surface to retain liquid droplets; or the presence of a liquid-gas-solid interface at the surface when the surface is completely submerged in liquid. For the purposes of this application, the term ultraphobic is used to refer generally to both ultrahydrophobic and ultralyophobic surfaces.

Figure 1E:
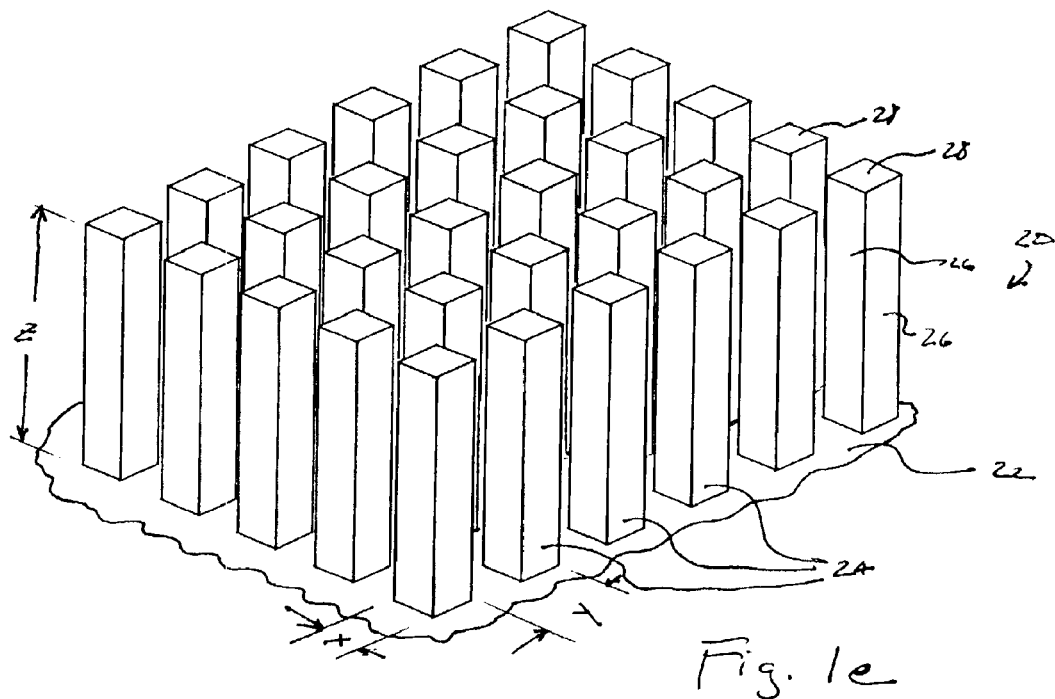
FIG. 1e is a perspective, enlarged view of an ultraphobic surface according to the present invention, wherein a multiplicity of nano/micro scale asperities are arranged in a rectangular array.
Figure 2:
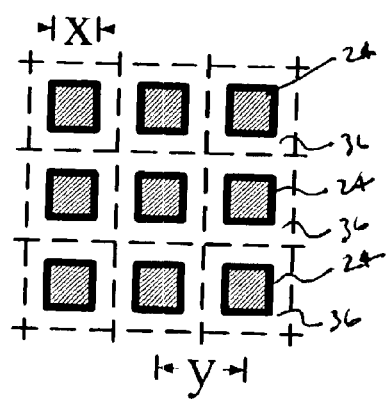
FIG. 2 is a top plan view of a portion of the surface of FIG. 1.
Figure 3:
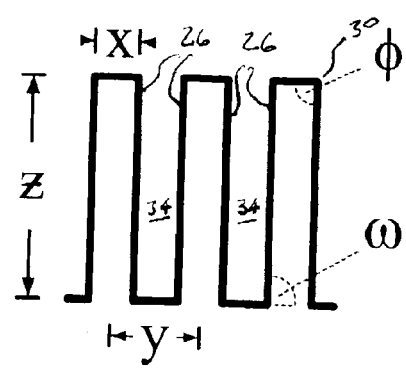
FIG. 3 is a side elevation view of the surface portion depicted in FIG. 2.

An enlarged view of one preferred embodiment of an ultraphobic surface 20 according to the present invention is depicted in FIG. 1e. The surface 20 generally includes a substrate 22 with a multiplicity of projecting asperities 24. Each asperity 24 has a plurality of sides 26 and a top 28.

Each asperity 24 has a width dimension, annotated "x" in the figures, and a height dimension, annotated "z" in the figures.

As depicted in FIGS. 1e–3, asperities 24 are disposed in a regular rectangular array, each asperity spaced apart from the adjacent asperities by a spacing dimension, annotated "y" in the figures. The angle subtended by the top edge 30 of the asperities 24 is annotated ψ, and the rise angle of the side 26 of the asperities 24 relative to the substrate 22 is annotated ω. The sum of the angles ψ and ω is 180 degrees.

Figure 7:
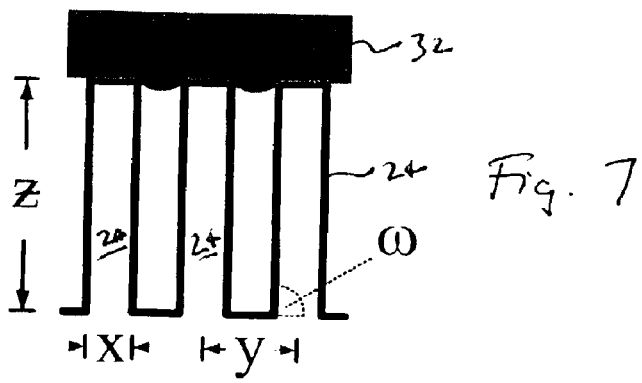
FIG. 7 is a side elevation view depicting a quantity of liquid suspended atop asperities.
Figure 8:
FIG. 8 is a side elevation view depicting the liquid contacting the bottom of the space between asperities.

Generally, surface 20 will exhibit ultraphobic properties when a liquid-solid-gas interface is maintained at the surface. As depicted in FIG. 7, if liquid 32 contacts only the tops 28 and a portion of the sides 26 proximate top edge 30 of asperities 24, leaving a space 34 between the asperities filled with air or other gas, the requisite liquid-solid-gas interface is present. The liquid may be said to be "suspended" atop and between the top edges 30 of the asperities 24.

As will be disclosed hereinbelow, the formation of the liquid-solid-gas interface depends on certain interrelated geometrical parameters of the asperities 24, the properties of the liquid, and the interaction of the liquid with the solid surface. According to the present invention, the geometrical properties of asperities 24 may be selected so that the surface 20 exhibits ultraphobic properties at any desired liquid pressure.

Referring to the rectangular array of FIGS. 1e–3, surface 20 may be divided into uniform areas 36, depicted bounded by dashed lines, surrounding each asperity 24. The area density of asperities (δ) in each uniform area 36 may be described by the equation:

$$\delta = \frac{1}{y^2}, \qquad (1)$$

where y is the spacing between asperities measured in meters.

For asperities 24 with a square cross-section as depicted in FIGS. 1e–3, the length of perimeter (p) of top 28 at top edge 30:

$$p=4x, \qquad (2)$$

where x is the asperity width in meters.

Perimeter p may be referred to as a "contact line" defining the location of the liquid-solid-gas interface. The contact line density (Λ) of the surface, which is the length of contact line per unit area of the surface, is the product of the perimeter (p) and the area density of asperities (δ) so that:

$$\Lambda=p\delta. \qquad (3)$$

For the rectangular array of square asperities depicted in FIGS. 1e–3:

$$\Lambda=4x/y^2. \qquad (4)$$

A quantity of liquid will be suspended atop asperities 24 if the body forces (F) due to gravity acting on the liquid are less than surface forces (f) acting at the contact line with the asperities. Body forces (F) associated with gravity may be determined according to the following formula:

$$F=\rho gh, \qquad (5)$$

where (ρ) is the density of the liquid, (g) is the acceleration due to gravity, and (h) is the depth of the liquid. Thus, for example, for a 10 meter column of water having an approximate density of 1000 kg/m³, the body forces (F) would be:

$$F=(1000 \text{ kg/m}^3)(9.8 \text{ m/s}^2)(10 \text{ m})=9.8\times10^4 \text{ kg/m}^2\text{-s}.$$

On the other hand, the surface forces (f) depend on the surface tension of the liquid (γ), its apparent contact angle with the side 26 of the asperities 24 with respect to the vertical $\theta_s$, the contact line density of the asperities (Λ) and the apparent contact area of the liquid (A):

$$f=-\Lambda A\gamma\cos\theta_s. \qquad (6)$$

The true advancing contact angle ($\theta_{a,0}$) of a liquid on a given solid material is defined as the largest experimentally measured stationary contact angle of the liquid on a surface of the material having essentially no asperities. The true advancing contact angle is readily measurable by techniques well known in the art.

Suspended drops on a surface with asperities exhibit their true advancing contact angle value ($\theta_{a,0}$) at the sides of the asperities. The contact angle with respect to the vertical at the side of the asperities ($\theta_s$) is related to the true advancing contact angle ($\theta_{a,0}$) by ψ or ω as follows:

$$\theta_s=\theta_{a,0}+90°-\psi=\theta_{a,0}+\omega-90°. \qquad (7)$$

By equating F and f and solving for contact line density Λ, a critical contact line density parameter $\Lambda_L$ may be determined for predicting ultraphobic properties in a surface:

$$\Lambda_L = \frac{-\rho gh}{\gamma\cos(\theta_{a,0} + \omega - 90°)}, \qquad (8)$$

where g is the density ρ of the liquid, (g) is the acceleration due to gravity, (h) is the depth of the liquid, the surface tension of the liquid (γ), ω is the rise angle of the side of the asperities relative to the substrate in degrees, and ($\theta_{a,0}$) is the experimentally measured true advancing contact angle of the liquid on the asperity material in degrees.

If $\Lambda>\Lambda_L$, the liquid will be suspended atop the asperities 24, producing an ultraphobic surface. Otherwise, if $\Lambda<\Lambda_L$, the liquid will collapse over the asperities and the contact interface at the surface will be solely liquid/solid, without ultraphobic properties.

It will be appreciated that by substituting an appropriate value in the numerator of the equation given above, a value of critical contact line density may be determined to design a surface that will retain ultraphobic properties at any desired amount of pressure. The equation may be generalized as:

$$\Lambda_L = \frac{-P}{\gamma\cos(\theta_{a,0} + \omega - 90°)}, \qquad (9)$$

where P is the maximum pressure under which the surface must exhibit ultraphobic properties in kilograms per square meter, γ is the surface tension of the liquid in Newtons per meter, $\theta_{a,0}$ is the experimentally measured true advancing contact angle of the liquid on the asperity material in degrees, and ω is the asperity rise angle in degrees.

It is generally anticipated that a surface 20 formed according to the above relations will exhibit ultraphobic properties under any liquid pressure values up to and including the value of P used in equation (9) above. The ultraphobic properties will be exhibited whether the surface is submerged, subjected to a jet or spray of liquid, or impacted with individual droplets. It will be readily appreciated that the pressure value P may be selected so as to be greater than the largest anticipated liquid or vapor pressure to which the carrier will be subjected during use or cleaning.

It will be generally appreciated that the value of P should be selected so as to provide an appropriate safety factor to account for pressures that may be momentarily or locally higher than anticipated, discontinuities in the surface due to tolerance variations, and other such factors.

If the surface 20 is intended for very low values of P where the liquid contact may be in the form of droplets on the surface, the value of P must be selected to account for the smaller apparent contact area of a droplet as opposed to a uniform layer of liquid. In general, the apparent contact area (A) in square meters of a small droplet on the surface is given by the relation:

$$A = \pi^{\frac{1}{3}}(6V)^{\frac{2}{3}}\left(\left(\frac{(1-\cos\theta_a)}{\sin\theta_a}\right)\left(3 + \left(\frac{(1-\cos\theta_a)}{\sin\theta_a}\right)^2\right)\right)^{-\frac{2}{3}}, \quad (10)$$

where V is the volume of the droplet in cubic meters, and $\theta_a$ is the apparent advancing contact angle of the droplet on the surface. The critical contact line density $\Lambda_L$ parameter for suspending a droplet on the surface becomes:

$$\Lambda_L = \frac{-\rho g(V)^{\frac{1}{3}}\left(\left(\frac{(1-\cos\theta_a)}{\sin\theta_a}\right)\left(3 + \left(\frac{(1-\cos\theta_a)}{\sin\theta_a}\right)^2\right)\right)^{-\frac{2}{3}}}{(36\pi)^{\frac{1}{3}}\gamma\cos(\theta_{a,0} + \omega - 90°)}, \quad (11)$$

where V is the volume of the droplet in cubic meters, (ρ) is the density of the liquid, (g) is the acceleration due to gravity, (γ) is the surface tension of the liquid, ω is the rise angle of the side of the asperities relative to the substrate in degrees, $\theta_a$ is the apparent advancing contact angle of the droplet on the surface, and $(\theta_{a,0})$ is the experimentally measured true advancing contact angle of the liquid on the asperity material in degrees. Equation 11 may be useful to check the value of P selected for low pressure ultraphobic surfaces to ensure that the surface will suspend droplets.

Once the value of critical contact line density is determined, the remaining details of the geometry of the asperities may be determined according to the relationship of x and y given in the equation for contact line density. In other words, the geometry of the surface may be determined by choosing the value of either x or y in the contact line equation and solving for the other variable.

Figure 6:
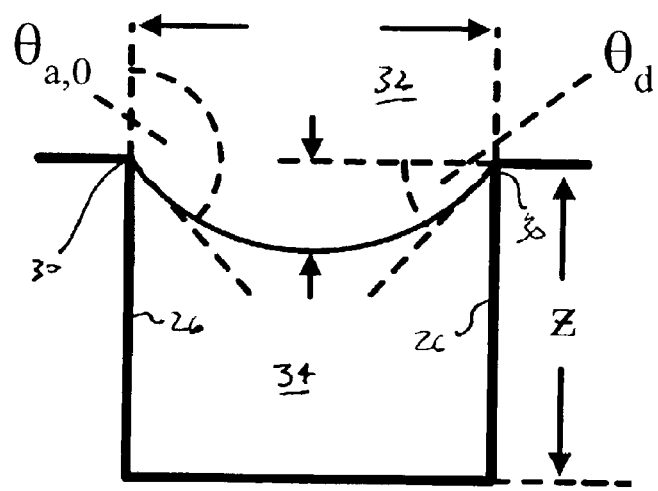
FIG. 6 is a side elevation view depicting the deflection of liquid suspended between asperities.

The liquid interface deflects downwardly between adjacent asperities by an amount $D_1$ as depicted in FIG. 6. If the amount $D_1$ is greater than the height (z) of the asperities 24, the liquid will contact the substrate 22 at a point between the asperities 24. If this occurs, the liquid will be drawn into space 34, and collapse over the asperities, destroying the ultraphobic character of the surface. The value of $D_1$ represents a critical asperity height ($Z_c$), and is determinable according to the following formula:

$$D_1 = Z_c = \frac{d(1 - \cos(\theta_{a,0} + \omega - 180°))}{2\sin(\theta_{a,0} + \omega - 180°)}, \quad (12)$$

where (d) is the distance between adjacent asperities, ω is the asperity rise angle, and $\theta_{a,0}$ is the experimentally measured true advancing contact angle of the liquid on the asperity material. The height (z) of asperities 24 must be at least equal to, and is preferably greater than, critical asperity height ($Z_c$).

Figure 9:
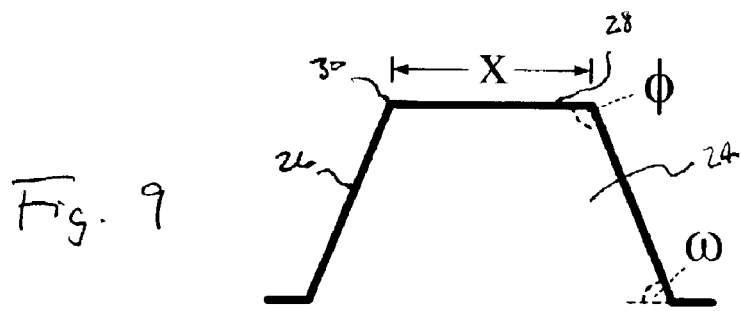
FIG. 9 is a side elevation view of a single asperity in an alternative embodiment of the invention wherein the asperity rise angle is an acute angle.
Figure 10:
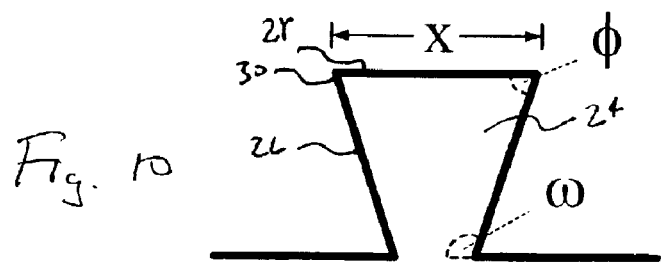
FIG. 10 is a side elevation view of a single asperity in an alternative embodiment of the invention wherein the asperity rise angle is an obtuse angle.

Although in FIGS. 1e–3 the asperity rise angle ω is 90 degrees, other asperity geometries are possible. For example, Co may be an acute angle as depicted in FIG. 9 or an obtuse angle as depicted in FIG. 10. Generally, it is preferred that ω be between 80 and 130 degrees.

Figure 14:
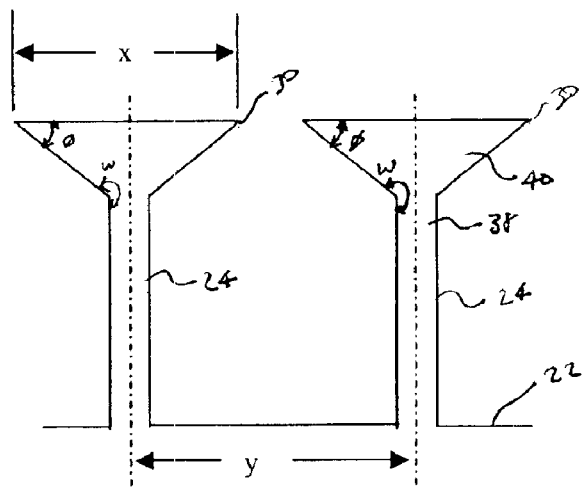
FIG. 14 is a side elevation view of an alternative embodiment of the present invention.
Figure 15:
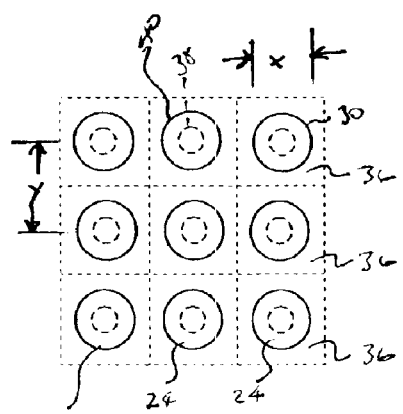
FIG. 15 is a top plan view of the alternative embodiment of FIG. 14.
Figure 16:
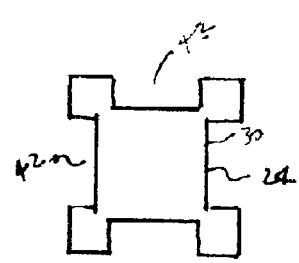
FIG. 16 is a top plan view of a single asperity in an alternative embodiment of the present invention.

It will also be appreciated that a wide variety of asperity shapes and arrangements are possible within the scope of the present invention. For example, asperities may be polyhedral, cylindrical as depicted in FIGS. 11–12, cylindroid, or any other suitable three dimensional shape. In addition, various strategies may be utilized to maximize contact line density of the asperities. As depicted in FIGS. 14 and 15, the asperities 24 may be formed with a base portion 38 and a head portion 40. The larger perimeter of head portion 40 at top edge 30 increases the contact line density of the surface. Also, features such as recesses 42 may be formed in the asperities 24 as depicted in FIG. 16 to increase the perimeter at top edge 30, thereby increasing contact line density. The asperities may also be cavities formed in the substrate.

Figure 4:
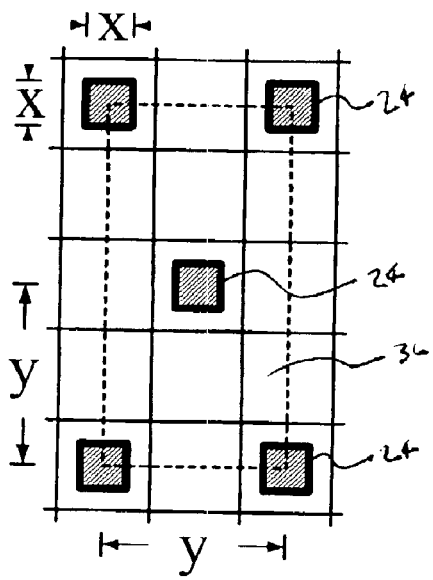
FIG. 4 is a partial top plan view of an alternative embodiment of the present invention wherein the asperities are arranged in a hexagonal array.
Figure 5:
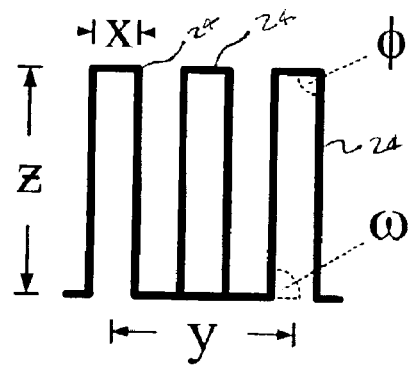
FIG. 5 is a side elevation view of the alternative embodiment of FIG. 4.

The asperities may be arranged in a rectangular array as discussed above, in a polygonal array such as the hexagonal array depicted in FIGS. 4–5, or a circular or ovoid arrangement. The asperities may also be randomly distributed so long as the critical contact line density is maintained, although such a random arrangement may have less predictable ultraphobic properties, and is therefore less preferred. In such a random arrangement of asperities, the critical contact line density and other relevant parameters may be conceptualized as averages for the surface. In the table of FIG. 13, formulas for calculating contact line densities for various other asperity shapes and arrangements are listed.

Generally, the substrate material may be any material upon which micro or nano scale asperities may be suitably formed and which is suitable for use in the processing environment in which the carrier is used. The asperities may be formed directly in the substrate material itself, or in one or more layers of other material deposited on the substrate material, by photolithography or any of a variety of suitable methods. A photolithography method that may be suitable for forming micro/nanoscale asperities is disclosed in PCT Patent Application Publication WO 02/084340, hereby fully incorporated herein by reference.

Other methods that may be suitable for forming asperities of the desired shape and spacing include nanomachining as disclosed in U.S. Patent Application Publication No. 2002/00334879, microstamping as disclosed in U.S. Pat. No. 5,725,788, microcontact printing as disclosed in U.S. Pat. No. 5,900,160, self-assembled metal colloid monolayers, as disclosed in U.S. Pat. No. 5,609,907, microstamping as disclosed in U.S. Pat. No. 6,444,254, atomic force microscopy nanomachining as disclosed in U.S. Pat. No. 5,252,835, nanomachining as disclosed in U.S. Pat. No. 6,403,388, sol-gel molding as disclosed in U.S. Pat. No. 6,530,554, self-assembled monolayer directed patterning of surfaces, as disclosed in U.S. Pat. No. 6,518,168, chemical etching as disclosed in U.S. Pat. No. 6,541,389, or sol-gel stamping as disclosed in U.S. Patent Application Publication No. 2003/0047822, all of which are hereby fully incorporated herein by reference. Carbon nanotube structures may also be usable to form the desired asperity geometries. Examples of carbon nanotube structures are disclosed in U.S. Patent Application Publication Nos. 2002/0098135 and 2002/0136683, also hereby fully incorporated herein by reference. Also, suitable asperity structures may be formed using known methods of printing with colloidal inks. Of course, it will be appreciated that any other method by which micro/nanoscale asperities may be formed with the requisite degree of precision may also be used.

In some applications, particularly where the carrier will not be subjected to high fluid pressures or where the surface is intended to repel droplets of liquid that may precipitate or condense on the surface, ultraphobic surface 20 may be formed with a coating of polymer material applied using known chemical vapor deposition or chemical surface modification techniques. For example, a thin layer of a low surface energy material may be applied to the surfaces of a carrier using gas phase polymerization. For the purposes of the present application, a low surface energy material is generally any material having a surface energy value lower than about 35 mN/m. The resulting ultraphobic surface 20 will be generally characterized by randomly shaped and arranged asperities formed in the low surface energy material. Alternatively, the carrier surfaces may be subjected to a chemical surface modification process, such as cold oxygen plasma, or corona discharge treatment. In sum, any process capable of producing randomly shaped and arranged asperities having the desired contact line density may be used and is contemplated within the scope of the invention.

In another embodiment for low fluid pressure applications, a fractal ultraphobic surface may be formed as a layer of material on the substrate. In one such embodiment, a layer of alkylketene dimer (AKD) or similar material may be melted or poured on the polymer substrate and allowed to harden in a nitrogen gas atmosphere. One suitable method for forming an AKD surface is more fully described by T. Onda, et. al., in an article entitled "Super Water Repellant Fractal Surfaces", Langmuir, Volume 12, Number 9, May 1, 1996, at page 2125, which article is fully incorporated herein by reference.

In another embodiment suitable for low fluid pressure applications, polymer material, such as polypropylene, may be dissolved in a solvent, such as p-xylene. A quantity of non-solvent such as methyl ethyl ketone may be added to the solution, and the solution deposited on the carrier substrate. When the solvent is evaporated, a porous, gel-like ultraphobic surface structure will result.

In each of the above polymer layers, the resulting surface will be generally characterized by randomly shaped and arranged micrometer scale asperities. Although the actual contact line density and critical contact line density values for such surfaces are difficult to determine due to the variations in individual asperities, these surfaces will exhibit ultraphobic properties if the contact line density value for the surface equals or exceeds the critical contact line density for the surface. For such surfaces, the actual contact line density will necessarily be an average value for the surface due to the variability of dimensions and geometry of individual asperities. In addition, asperity rise angle ω in equations 9 and 11 should be an average value for the surface.

The present invention may be embodied in other specific forms without departing from the spirit or essential attributes thereof, and it is, therefore, desired that the present embodiment be considered in all respects as illustrative and not restrictive.

What is claimed is:

1. A carrier for articles comprising:
a body having a substrate portion with a surface, at least a portion of said surface having a multiplicity of substantially uniformly shaped asperities thereon to form an ultraphobic surface, each asperity having a common asperity rise angle relative to the substrate portion, the asperities positioned so that the ultraphobic surface defines a contact line density measured in meters of contact line per square meter of surface area equal to or greater than a contact line density value "$\Lambda_L$" determined according to the formula:

$$\Lambda_L = \frac{-P}{\gamma \cos(\theta_{a,0} + \omega - 90°)}$$

where γ is the surface tension of a liquid in contact with the surface in Newtons per meter, $\theta_{a,0}$ is the experimentally measured true advancing contact angle of the liquid on the asperity material in degrees, ω is the asperity rise angle in degrees, and P is a predetermined liquid pressure value in kilograms per meter, wherein the ultraphobic surface exhibits a liquid-solid-gas interface with the liquid at liquid pressures up to and including the predetermined liquid pressure value.

2. The carrier of claim 1, wherein the asperities are projections.

3. The carrier of claim 2, wherein the asperities are polyhedrally shaped.

4. The carrier of claim 2, wherein each asperity has a generally square transverse cross-section.

5. The carrier of claim 2, wherein the asperities are cylindrical or cylindroidally shaped.

6. The carrier of claim 1, wherein the asperities are cavities formed in the substrate.

7. The carrier of claim 1, wherein the asperities are positioned in a substantially uniform array.

8. The carrier of claim 7, wherein the asperities are positioned in a rectangular array.

9. The carrier of claim 1, wherein the asperities have a substantially uniform asperity height relative to the substrate portion, and wherein the asperity height is greater than a critical asperity height value "$Z_c$" in meters determined according to the formula:

$$Z_c = \frac{d(1 - \cos(\theta_{a,0} + \omega - 180°))}{2\sin(\theta_{a,0} + \omega - 180°)}$$

where d is the distance in meters between adjacent asperities, $\theta_{a,0}$ is the experimentally measured true advancing contact angle of the liquid on the asperity material in degrees, and ω is the asperity rise angle in degrees.

10. A process of making a carrier with an ultraphobic surface portion, the process comprising:
providing a carrier including a substrate having an outer surface; and
forming a multiplicity of substantially uniformly shaped asperities on the outer surface of the substrate, each asperity having a common asperity rise angle relative to the substrate portion, the asperities positioned so that the surface has a contact line density measured in meters of contact line per square meter of surface area equal to or greater than a contact line density value "$\Lambda_L$" determined according to the formula:

$$\Lambda_L = \frac{-P}{\gamma \cos(\theta_{a,0} + \omega - 90°)}$$

where γ is the surface tension of a liquid in contact with the surface in Newtons per meter, $\theta_{a,0}$ is the experimentally measured true advancing contact angle of the liquid on the asperity material in degrees, ω is the asperity rise angle in degrees, and P is a predetermined liquid pressure value in kilograms per meter, wherein the ultraphobic surface exhibits a liquid-solid-gas interface with the liquid at liquid pressures up to and including the predetermined liquid pressure value.

11. The process of claim 10, wherein the asperities are formed by photolithography.

12. The process of claim 10, wherein the asperities are formed by a process selected from the group consisting of nanomachining, microstamping, microcontact printing, self-assembling metal colloid monolayers, atomic force microscopy nanomachining, sol-gel molding, self-assembled monolayer directed patterning, chemical etching, sol-gel stamping, printing with colloidal inks, and disposing a layer of parallel carbon nanotubes on the substrate.

13. A process for producing a carrier having a surface with ultraphobic properties at liquid pressures up to a predetermined pressure value, the process comprising:

selecting an asperity rise angle;

determining a critical contact line density "$\Lambda_L$" value according to the formula:

$$\Lambda_L = \frac{-P}{\gamma \cos(\theta_{a,0} + \omega - 90°)}$$

where P is the predetermined pressure value, $\gamma$ is the surface tension of the liquid, $\theta_{a,0}$ is the experimentally measured true advancing contact angle of the liquid on the asperity material in degrees, and $\omega$, is the asperity rise angle;

providing a carrier with a substrate portion; and forming a multiplicity of projecting asperities on the substrate portion, so that the surface has an actual contact line density equal to or greater than the critical contact line density.

14. The process of claim 13, wherein the asperities are formed using photolithography.

15. The process of claim 13, wherein the asperities are formed using wherein the asperities are formed using nanomachining, microstamping, microcontact printing, self-assembling metal colloid monolayers, atomic force microscopy nanomachining, sol-gel molding, self-assembled monolayer directed patterning, chemical etching, sol-gel stamping, printing with colloidal inks, or by disposing a layer of parallel carbon nanotubes on the substrate.

16. The process of claim 13, further comprising the step of selecting a geometrical shape for the asperities.

17. The process of claim 13, further comprising the step of selecting an array pattern for the asperities.

18. The process of claim 13, further comprising the steps of selecting at least one dimension for the asperities and determining at least one other dimension for the asperities using an equation for contact line density.

19. The process of claim 13, further comprising the step of determining a critical asperity height value "$Z_c$" in meters according to the formula:

$$Z_c = \frac{d(1 - \cos(\theta_{a,0} + \omega - 180°))}{2\sin(\theta_{a,0} + \omega - 180°)}$$

where d is the distance in meters between adjacent asperities, $\theta_{a,0}$ is the true advancing contact angle of the liquid on the surface in degrees, and $\omega$ is the asperity rise angle in degrees.

20. A carrier for articles comprising:

a body having a substrate and a polymer outer layer on the substrate, the outer layer having a surface with a multiplicity of asperities thereon forming an ultraphobic surface for contacting a liquid, the asperities distributed so that the surface has an average contact line density equal to or greater than a critical contact line density value $\Lambda_L$ determined according to the formula:

$$\Lambda_L = \frac{-P}{\gamma \cos(\theta_{a,0} + \omega - 90°)}$$

where $\gamma$ is the surface tension of a liquid in contact with the surface in Newtons per meter, θa,0 is the experimentally measured true advancing contact angle of the liquid on the asperity material in degrees, $\omega$ is the asperity rise angle in degrees, and P is a predetermined liquid pressure value in kilograms per meter, and wherein the ultraphobic surface exhibits a liquid-solid-gas interface with the liquid at liquid pressures up to and including the predetermined liquid pressure value.

21. the carrier of claim 20, wherein the polymer outer layer includes a low surface energy material.

22. The carrier of claim 21, wherein the low surface energy material is a fluoropolymer.

23. The carrier of claim 20, wherein the polymer outer layer includes alkylketene dimer.

24. A carrier for articles comprising:

a body having a substrate and a polymer outer layer on the substrate, the outer layer having a surface with a multiplicity of asperities thereon forming an ultraphobic surface for contacting a liquid in the form of a droplet, the asperities distributed so that the surface has an average contact line density equal to or greater than a critical contact line density value $\Lambda$ determined according to the formula:

$$\Lambda_L = \frac{-\rho g (V)^{\frac{1}{3}} \left( \left( \frac{(1-\cos\theta_a)}{\sin\theta_a} \right) \left( 3 + \left( \frac{(1-\cos\theta_a)}{\sin\theta_a} \right)^2 \right) \right)^{\frac{2}{3}}}{(36\pi)^{\frac{1}{3}} \gamma \cos(\theta_{a,0} + \omega - 90°)},$$

where V is the volume of the droplet in cubic meters, g is the density (p) of the liquid in kilograms per cubic meter, (g) is the acceleration due to gravity in meters per second squared, (h) is the depth of the liquid in meters, ($\gamma$) is the surface tension of the liquid in Newtons per meter, $\omega$ is the average rise angle of the side of the asperities relative to the substrate in degrees, $\theta_a$ is the apparent advancing contact angle of the droplet on the surface, and ($\theta_{a,0}$) is the experimentally measured true advancing contact angle of the liquid on the asperity material in degrees.

25. A process of making a carrier with an ultraphobic surface portion, the process comprising:

providing a carrier including a substrate having an outer surface; and forming the ultraphobic surface portion by depositing a layer of polymer material on the outer surface using a chemical vapor deposition process, the layer of polymer material having an outer surface with a multiplicity of asperities, the asperities distributed so that the ultraphobic surface has a contact line density measured in meters of contact line per square meter of surface area equal to or greater than a critical contact line density value "$\Lambda_L$" determined according to the formula:

$$\Lambda_L = \frac{-P}{\gamma \cos(\theta_{a,0} + \omega - 90°)}$$

where $\gamma$ is the surface tension of a liquid in contact with the surface in Newtons per meter, $\theta_{a,0}$ is the experimentally measured true advancing contact angle of the liquid on the asperity material in degrees, $\omega$ is the asperity rise angle in degrees, and P is a predetermined liquid pressure value in kilograms per meter, wherein the ultraphobic surface exhibits a liquid-solid-gas interface with the liquid at liquid pressures up to and including the predetermined liquid pressure value.

* * * * *